(12) United States Patent
De Keyser et al.

(10) Patent No.: US 10,379,953 B2
(45) Date of Patent: *Aug. 13, 2019

(54) DISTRIBUTED OBJECT STORAGE SYSTEM

(71) Applicant: AMPLIDATA N.V., Ghent (BE)

(72) Inventors: Koen De Keyser, Sint-Denijs Westrem (BE); Frederik De Schrijver, Wenduine (BE); Bastiaan Stougie, Melle (BE)

(73) Assignee: Western Digital Technologies, Inc., San Jose, CA (US)

( * ) Notice: Subject to any disclaimer, the term of this patent is extended or adjusted under 35 U.S.C. 154(b) by 70 days.

This patent is subject to a terminal disclaimer.

(21) Appl. No.: 15/451,019

(22) Filed: Mar. 6, 2017

(65) Prior Publication Data

US 2017/0177440 A1    Jun. 22, 2017

Related U.S. Application Data

(63) Continuation of application No. 13/909,337, filed on Jun. 4, 2013, now Pat. No. 9,588,862.

(30) Foreign Application Priority Data

Jun. 4, 2012 (EP) ..................... 12170698

(51) Int. Cl.
*G06F 11/00* (2006.01)
*G06F 11/10* (2006.01)
*G06F 11/30* (2006.01)
*G06F 11/16* (2006.01)
*G06F 11/20* (2006.01)
(Continued)

(52) U.S. Cl.
CPC .......... *G06F 11/1092* (2013.01); *G06F 3/064* (2013.01); *G06F 3/067* (2013.01); *G06F 3/0619* (2013.01); *G06F 3/0653* (2013.01); *G06F 11/1088* (2013.01); *G06F 11/1662* (2013.01); *G06F 11/2094* (2013.01); *G06F 11/30* (2013.01); *G06F 11/3034* (2013.01);
(Continued)

(58) Field of Classification Search
CPC ......... G06F 2211/1028; G06F 11/1092; G06F 11/2094; G06F 11/08; G06F 11/1004; G06F 11/1016; G06F 11/1088; G06F 11/14; H04L 67/34
See application file for complete search history.

(56) References Cited

U.S. PATENT DOCUMENTS 5,546,409 A   8/1996   Karasawa
5,901,157 A   5/1999   Hogan
(Continued)

FOREIGN PATENT DOCUMENTS

EP    2 164 006 A2    3/2010

OTHER PUBLICATIONS

European Search Report issue in EP 12 17 0698.0, dated Oct. 5, 2012 9 pages.

*Primary Examiner* — Loan L. T. Truong
(74) *Attorney, Agent, or Firm* — Patent Law Works LLP

(57) ABSTRACT

A distributed object storage system has a monitoring agent and/or a maintenance agent configured to determine for each of a plurality of repair tasks the actual concurrent failure tolerance of a corresponding repair data object. The actual concurrent failure tolerance corresponds to the number of storage elements that store sub blocks of the repair data object and are allowed to fail concurrently.

15 Claims, 7 Drawing Sheets

(51) Int. Cl.
*G06F 3/06* (2006.01)
*H03M 13/15* (2006.01)
*H03M 13/00* (2006.01)

(52) U.S. Cl.
CPC ....... *G06F 11/3055* (2013.01); *H03M 13/154* (2013.01); *H03M 13/6502* (2013.01)

(56) References Cited

U.S. PATENT DOCUMENTS

| | | | |
|---|---|---|---|
| 6,430,723 | B2 | 8/2002 | Kodama |
| 6,532,548 | B1 | 3/2003 | Hughes |
| 6,567,891 | B2 | 5/2003 | Oldfield |
| 7,017,102 | B1 | 3/2006 | Kristensson |
| 7,149,947 | B1 | 12/2006 | MacLellan |
| 7,188,295 | B2 | 3/2007 | Van Dijk |
| 7,418,620 | B1 | 8/2008 | Tormasov et al. |
| 7,500,157 | B2 | 3/2009 | Kim et al. |
| 7,823,009 | B1* | 10/2010 | Tormasov ............ G06F 11/1076 714/6.12 |
| 7,979,776 | B2 | 7/2011 | Hwang et al. |
| 8,341,498 | B2 | 12/2012 | D'Abreu |
| 8,402,346 | B2 | 3/2013 | Goel |
| 8,418,026 | B2 | 4/2013 | D'Abreu et al. |
| 8,495,417 | B2* | 7/2013 | Jernigan, IV ....... G06F 11/1076 711/114 |
| 8,527,838 | B2* | 9/2013 | Grube ................... G06F 9/4401 714/764 |
| 8,560,898 | B2 | 10/2013 | Liu et al. |
| 8,868,505 | B1 | 10/2014 | Jayanthi |
| 9,141,679 | B2* | 9/2015 | Gopalan ............... G06F 16/25 |
| 9,213,596 | B2 | 12/2015 | Greenfield |
| 2002/0056065 | A1* | 5/2002 | Jung ........................ H04L 12/66 714/758 |
| 2002/0059539 | A1 | 5/2002 | Anderson |
| 2006/0053287 | A1 | 3/2006 | Kitamura |
| 2006/0294440 | A1* | 12/2006 | Riley ..................... G11C 29/44 714/710 |
| 2007/0115720 | A1 | 5/2007 | Cohen |
| 2008/0183975 | A1* | 7/2008 | Foster ................. G06F 11/1076 711/153 |
| 2009/0265360 | A1* | 10/2009 | Bachwani ............. G06F 11/008 |
| 2010/0107015 | A1* | 4/2010 | Bernabeu-Auban ........................ G06F 11/008 714/38.14 |
| 2010/0169280 | A1* | 7/2010 | Shi ........................ H04L 67/104 707/640 |
| 2010/0199123 | A1* | 8/2010 | Cohen ................. G06F 11/1662 714/4.1 |
| 2010/0262889 | A1* | 10/2010 | Bains .................. G06F 11/008 714/758 |
| 2010/0281341 | A1* | 11/2010 | Wu ..................... G06F 11/1068 714/763 |
| 2011/0029809 | A1* | 2/2011 | Dhuse ................. G06F 11/1076 714/6.1 |
| 2012/0166726 | A1* | 6/2012 | De Schrijver ...... G06F 11/2094 711/114 |
| 2013/0275381 | A1* | 10/2013 | De Schrijvr ........ G06F 11/1076 707/652 |
| 2013/0275815 | A1* | 10/2013 | De Keyser .............. G06F 11/30 714/47.2 |
| 2014/0152476 | A1 | 6/2014 | Oggier et al. |
| 2015/0006816 | A1* | 1/2015 | Gong .................... G06F 3/0647 711/114 |
| 2015/0193309 | A1* | 7/2015 | Khadiwala .......... G06F 11/1435 714/4.11 |
| 2016/0335158 | A1* | 11/2016 | De Schrijver ...... G06F 11/1076 |
| 2016/0373291 | A1* | 12/2016 | Dornemann ........... H04L 67/28 |
| 2018/0075123 | A1* | 3/2018 | Kazi ...................... H04L 67/34 |
| 2018/0189137 | A1* | 7/2018 | De Keyser ............ G06F 16/185 |

* cited by examiner

| 730 | REP.OBJ.ID | ACFT | DIFF | 750 |
|---|---|---|---|---|
| | A | 4 | 2 | 720 |
| | B | 4 | 4 | |
| | C | 5 | 1 | |

Fig. 8

| 830 | SE.ID | ERROR | 800 |
|---|---|---|---|
| | 1 | 1 | 810 |
| | 2 | 1 | 820 |
| | 3 | 0 | |
| | ... | ... | |
| | 21 | 1 | |
| | 22 | 1 | |
| | ... | ... | |

Fig. 9

| 510 | OBJ.ID | SE.ID | ENC | 900 |
|---|---|---|---|---|
| | A | 1, 2, 3, 4, 5, 6, 7, 8, 9, 10, 11, 12, 13, 14, 15, 16 | 16/10 | 910 |
| | B | 1, 2, 3, 4, 5, 6, 7, 8, 9, 10, 11, 12, 13, 14, 15, 16, 21, 22 | 18/10 | |
| | C | 2, 3, 4, 5, 6, 7, 8, 9, 10, 11, 12, 13, 14, 15, 16, 17 | 16/10 | |

Fig. 10

DISTRIBUTED OBJECT STORAGE SYSTEM

CROSS REFERENCE TO RELATED APPLICATIONS

This application is a continuation of and claims priority to U.S. application Ser. No. 13/909,337, filed Jun. 4, 2013, titled "A Distributed Object Storage System," which claims priority under 35 U.S.C. § 119 to corresponding EPO Application No. EP 12170698.0 filed Jun. 4, 2012, titled "A Distributed Object Storage System" each of which is incorporated by reference herein in its entirety.

BACKGROUND

The present invention generally relates to distributed data storage systems. Typically, such distributed storage systems are targeted at storing large amounts of data, such as objects or files in a distributed and fault tolerant manner with a predetermined level of redundancy. The present invention relates more particularly to a distributed object storage system.

The advantages of object storage systems, which store data objects referenced by an object identifier versus file systems, such as for example US2002/0078244, which store files referenced by an inode or block based systems which store data blocks referenced by a block address, in terms of scalability and flexibility are well known. Object storage systems in this way are able to surpass the maximum limits for storage capacity of file systems in a flexible way such that for example storage capacity can be added or removed in function of the needs, without degrading its performance as the system grows. This makes such object storage systems excellent candidates for large scale storage systems.

Such large-scale storage systems are required to distribute the stored data objects in the object storage system over multiple storage elements, such as for example hard disks, or multiple components such as storage nodes comprising a plurality of such storage elements. However, as the number of storage elements in such a distributed object storage system increases, equally the probability of failure of one or more of these storage elements increases. To cope therewith it is required to introduce a level of redundancy into the distributed object storage system. This means that the distributed object storage system must be able to cope with a failure of one or more storage elements without data loss. In its simplest form redundancy is achieved by replication, this means storing multiple copies of a data object on multiple storage elements of the distributed object storage system. In this way when one of the storage elements storing a copy of the data object fails, this data object can still be recovered from another storage element holding a copy. Several schemes for replication are known in the art, in general replication is costly as the storage capacity is concerned. This means that in order to survive two concurrent failures of a storage element of a distributed object storage system, at least two replica copies for each data object are required, which results in storage capacity overhead of 200%, which means that for storing 1 GB of data objects a storage capacity of 3 GB is required. Another well-known scheme is referred to as RAID systems of which some implementations are more efficient than replication as storage capacity overhead is concerned. However, often RAID systems require a form of synchronisation of the different storage elements and require them to be of the same type and in the case of drive failure require immediate replacement, followed by a costly and time consuming rebuild process.

Therefor known systems based on replication or known RAID systems are generally not configured to survive more than two concurrent storage element failures. Therefor it has been proposed to use distributed object storage systems that are based on erasure encoding, such as for example described in WO2009135630, US2007/0136525 or US2008/313241. Such a distributed object storage system stores the data object in encoded sub blocks that are spread amongst the storage elements in such a way that for example a concurrent failure of six storage elements can be tolerated with a corresponding storage overhead of 60%, that means that 1 GB of data objects only require a storage capacity of 1.6 GB.

Such an erasure encoding based districted object storage system for large scale data storage also requires a form a self-healing functionality in order to restore the required redundancy policy after for example the failure of a storage element. However, in most known systems these self-healing methods lack efficiency and consume considerable amounts of processing power and/or network bandwidth in order for example to cope with restoring the redundancy for the stored data objects on a failed storage element. One system that tries to improve efficiency is for example described in WO2010/091101, however this system could result in data loss after subsequent generations of node failure. Furthermore, this system is only able to handle the restore of a complete storage element and all objects on it. It is further not able to handle simultaneous replacement of a plurality of storage elements reliably and efficiently as for every failing storage element a new storage element needs to be provided for the restore operation.

In general, during maintenance of a large scale distributed object storage system, adding, removing and/or replacing storage elements or even complete storage nodes is an activity that is performed almost constantly. However, in prior art systems the efficiency of repair activity during normal operation does not suffice to reliably cope with these maintenance activities resulting in manual configuration or supplementary restore operations to be performed in order to sufficiently safeguard the reliability of the distributed object storage system.

Therefor there still exists a need for an efficient and reliable monitoring and repair process for a distributed object storage system, that does not result in data loss in the long term and is able to realize a large scale, self-healing distributed object storage system. Further there exists a need for the self-healing efficiency being sufficiently high such that the need for manual configuration or supplementary restore operations is reduced even during extensive changes to the available storage elements or storage nodes.

SUMMARY

According to a first aspect of the invention, there is provided a distributed object storage system, comprising: a plurality of storage elements configured to store and retrieve a data object, the data object stored as a first number of redundant sub blocks; a controller node coupled with the plurality of storage elements, the controller node including: a monitoring agent configured to identify that the data object is not correctly stored in the distributed object storage system and, in response, generate a repair task for the data object; a maintenance agent configured to execute the repair task; a clustering module configured to retrieve remaining redundant sub blocks of the data object and determine a number of missing redundant sub blocks of the data object; a decoding module configured to assemble a repair data object from the remaining redundant sub blocks of the data object; an encoding module to disassemble the repair data object into a second number of redundant sub blocks, the second number of redundant sub blocks being greater than or equal to the number of missing redundant sub blocks of the data object; and a spreading module configured to store the second number of sub blocks to the plurality of storage elements such that the second number of redundant sub blocks and the remaining redundant sub blocks is greater than or equal to a desired spreading width for the data object.

BRIEF DESCRIPTION OF THE DRAWINGS

FIG. 8 schematically illustrates a repair task list;

FIG. 9 schematically illustrates a central infrastructure metadata storage;

FIG. 10 schematically illustrates a metadata storage;

DETAILED DESCRIPTION

Figure 1:
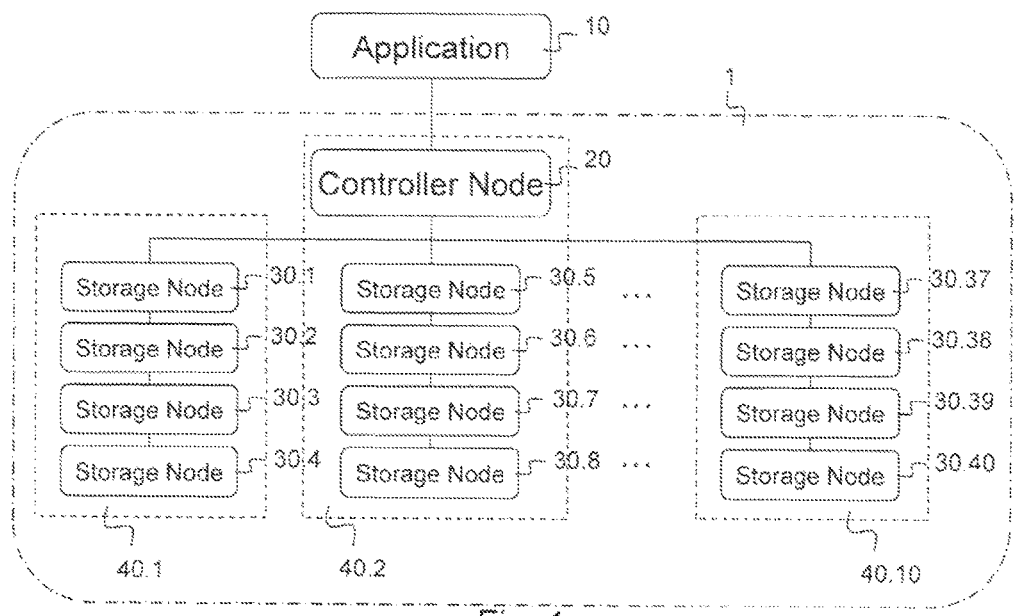
FIG. 1 illustrates a distributed object storage system according to the invention.

FIG. 1 shows a distributed object storage system 1 according to the invention. It is connected to an application 10 for transferring data objects. This connection could be implemented as a suitable data communication network. Such an application could for example be a dedicated software application running on a computing device, such as a personal computer, a lap top, a wireless telephone, a personal digital assistant or any other type of communication device, that is able to interface directly with the distributed object storage system 1, but said application 10 could alternatively comprise a suitable file system which enables a general purpose software application to interface with the distributed object storage system 1 or an Application Programming Interface library. As further shown in FIG. 1 the distributed object storage system comprises a controller node 20 and a plurality of storage nodes 30.1-30.40 all interconnected in a suitable way for transferring data, for example by means of a conventional data communication network such as a local area network (LAN), a wide area network (WAN), a telephone network, such as the Public Switched Telephone Network (PSTN), an intranet, the internet, any other suitable network or combination of networks. Controller nodes 20, storage nodes 30 and the device comprising application 10 may connect to said data communication network by wired, wireless and/or optical connections.

According to alternative embodiments of the distributed object storage system could comprise any other suitable number of storage nodes 30 and for example two three or more controller nodes 20 also connected to these storage nodes 20. These controller nodes 20 and storage nodes 30 can be built as general purpose computers, however more frequently they are physically adapted for arrangement in large data centres, where they are arranged in modular racks 40 comprising standard dimensions. Particular controller nodes 20 and storage nodes 30, such as for example the Amplistor AS20 storage node as manufactured by Amplidata, are dimensioned to take up a single unit of such rack 40, which is generally referred to as 1U.

As shown in FIG. 1 several storage nodes 30 can be grouped together, for example because they are housed in a single rack 40. For example, storage nodes 30.1-30.4; 30.5-30.8; . . . ; and 30.7-30.40 each are respectively grouped into racks 40.1, 40.2, . . . 40.10. Controller node 20 could for example be located in rack 40.2. These racks are not required to be located at the same location, they are often geographically dispersed across different data centres, such as for example rack 40.1-40.3 can be located at a data centre in Europe, 40.4-40.7 at a data centre in the USA and 40.8-40.10 at a data centre in China.

Figure 2:
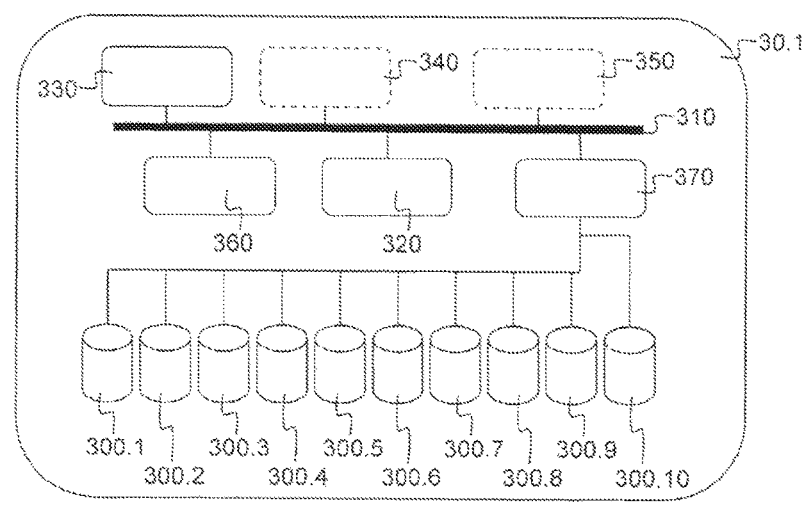
FIG. 2 schematically illustrates a storage node of the distributed object storage system of FIG. 1.

FIG. 2 shows a schematic representation of one of the storage nodes 30. Storage node 30.1 may comprise a bus 310, a processor 320, a local memory 330, one or more optional input units 340, one or more optional output units 350, a communication interface 360, a storage element interface 370 and a plurality of storage elements 300.1-300.10. Bus 310 may include one or more conductors that permit communication among the components of storage node 30.1. Processor 320 may include any type of conventional processor or microprocessor that interprets and executes instructions. Local memory 330 may include a random-access memory (RAM) or another type of dynamic storage device that stores information and instructions for execution by processor 320 and/or a read only memory (ROM) or another type of static storage device that stores static information and instructions for use by processor 320. Input unit 340 may include one or more conventional mechanisms that permit an operator to input information to said storage node 30.1, such as a keyboard, a mouse, a pen, voice recognition and/or biometric mechanisms, etc. Output unit 350 may include one or more conventional mechanisms that output information to the operator, such as a display, a printer, a speaker, etc. Communication interface 360 may include any transceiver-like mechanism that enables storage node 30.1 to communicate with other devices and/or systems, for example mechanisms for communicating with other storage nodes 30 or controller nodes 20 such as for example two 1 Gb Ethernet interfaces. Storage element interface 370 may comprise a storage interface such as for example a Serial Advanced Technology Attachment (SATA) interface or a Small Computer System Interface (SCSI) for connecting bus 310 to one or more storage elements 300, such as one or more local disks, for 2 TB SATA-II disk drives, and control the reading and writing of data to/from these storage elements 300. In one exemplary embodiment as shown in FIG. 2, such a storage node 30.1 could comprise ten 2 TB SATA-II disk drives as storage elements 300.1-300.10 and in this way storage node 30.1 would provide a storage capacity of 20 TB to the distributed object storage system 1. According to the exemplary embodiment of FIG. 1 and in the event that storage nodes 30.2-30.40 are identical to storage node 30.1, the distributed object storage system 1 would then have a total storage capacity of 800 TB.

Taking into account FIGS. 1 and 2 the distributed object storage system 1 comprises a plurality of redundant storage elements 300. The storage nodes 30 each comprise a share of these storage elements 300. As shown in FIG. 1 storage node 30.1 comprises ten storage elements 300.1-300.10.

Other storage nodes 30 could comprise a similar amount of storage elements, but this is however not essential. Storage node 30.2 could for example comprise eight storage elements 300.11-300.18. As will be explained in further detail below with respect to FIGS. 5 and 6, the distributed object storage system 1 is operable to store and retrieve a data object 500 comprising object data 520, for example 64 MB of binary data and a data object identifier 510 for addressing this data object 500, for example a universally unique identifier such as a globally unique identifier (GUID). Storing the data offered for storage by the application 10 in the form of a data object, also referred to as object storage, has specific advantages over other storage schemes such as conventional block based storage or conventional file based storage, such as scalability and flexibility, which are of particular importance in a distributed object storage system 1 that is directed to large scale redundant storage applications, sometimes also referred to as cloud storage.

The storage elements 300 are redundant and operate independently of one another. This means that if one particular storage element 300 fails its function can easily be taken on by another storage element 300 in the distributed storage system. However as will be explained in more detail further below, there is no need for the storage elements 300 to work in synchronism, as is for example the case in many well-known RAID configurations, which sometimes even require disc spindle rotation to be synchronised. Furthermore, the independent and redundant operation of the storage elements 300 allows to use any suitable mix of types storage elements 300 to be used in a particular distributed object storage system 1. It is possible to use for example storage elements with differing storage capacity, storage elements of differing manufacturers, using different hardware technology such as for example conventional hard disks and solid state storage elements, using different storage interfaces such as for example different revisions of SATA, PATA and so on. All this results in specific advantages for scalability and flexibility of the distributed object storage system 1 as it allows to add, replace or remove storage elements 300 without imposing specific requirements to their design in correlation to other storage elements 300 already in use in that distributed object storage system 1.

Figure 3:
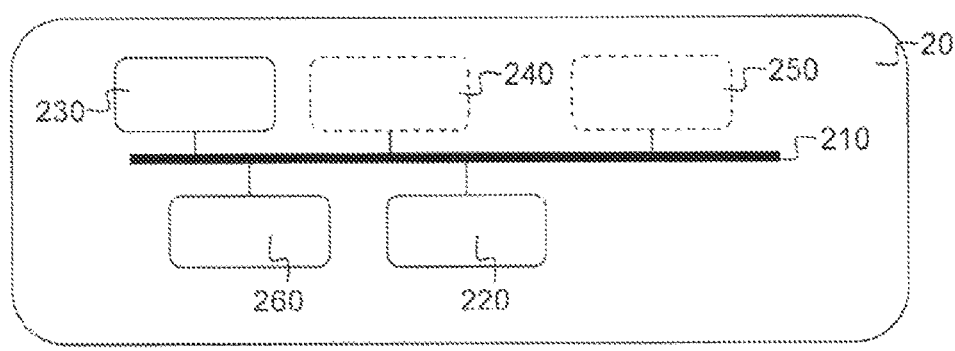
FIG. 3 schematically illustrates a controller node of the distributed object storage system of FIG. 1.

FIG. 3 shows a schematic representation of the controller nodes 20. Controller node 20 may comprise a bus 210, a processor 220, a local memory 230, one or more optional input units 240, one or more optional output units 250. Bus 210 may include one or more conductors that permit communication among the components of controller node 20. Processor 220 may include any type of conventional processor or microprocessor that interprets and executes instructions. Local memory 230 may include a random-access memory (RAM) or another type of dynamic storage device that stores information and instructions for execution by processor 220 and/or a read only memory (ROM) or another type of static storage device that stores static information and instructions for use by processor 320 and/or any suitable storage element such as a hard disc or a solid-state storage element. An optional input unit 240 may include one or more conventional mechanisms that permit an operator to input information to said controller node 20 such as a keyboard, a mouse, a pen, voice recognition and/or biometric mechanisms, etc. Optional output unit 250 may include one or more conventional mechanisms that output information to the operator, such as a display, a printer, a speaker, etc. Communication interface 260 may include any transceiver-like mechanism that enables controller node 20 to communicate with other devices and/or systems, for example mechanisms for communicating with other storage nodes 30 or controller nodes 20 such as for example two 10 Gb Ethernet interfaces.

According to an alternative embodiment the controller node 20 could have an identical design as a storage node 30, or according to still a further alternative embodiment one of the storage nodes 30 of the distributed object storage system could perform both the function of a controller node 20 and a storage node 30. According to still a further embodiment the device on which the application 10 runs is a controller node 20.

Figure 4:
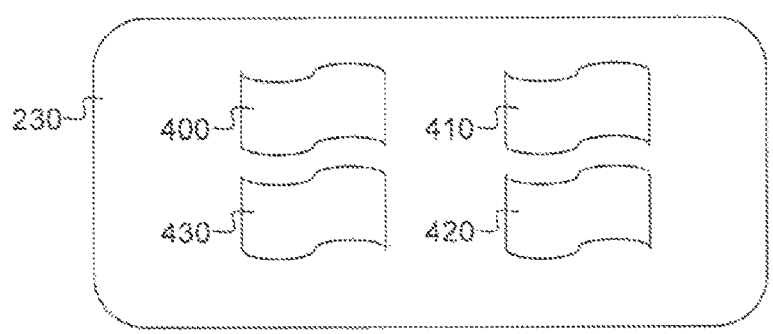
FIG. 4 schematically illustrates some elements of the controller node of FIG. 3 in more detail.

As schematically shown in FIG. 4, controller node 20 comprises four modules: an encoding module 400; a spreading module 410; a clustering module 420; and a decoding module 430. These modules 400, 410, 420, 430 can be implemented as programming instructions stored in local memory 230 of the controller node 20 for execution by its processor 220.

The functioning of these modules 400, 410, 420, 430 will now be explained to FIGS. 5 and 6. The distributed object storage system 1 stores a data object 500 offered by the application 10 in function of a reliability policy which guarantees a level of redundancy. That means that the distributed object storage system 1 must for example guarantee that it will be able to correctly retrieve data object 500 even if a number of storage elements 300 would be unavailable, for example because they are damaged or inaccessible. Such a reliability policy could for example require the distributed object storage system 1 to be able to retrieve the data object 500 in case of six concurrent failures of the storage elements 300 it comprises. In large scale data storage, massive amounts of data are stored on storage elements 300 that are individually unreliable, as such redundancy must be introduced into the storage system to improve reliability. However, the most commonly used form of redundancy, straightforward replication of the data on multiple storage elements 300 is only able to achieve acceptable levels of reliability at the cost of unacceptable levels of overhead. For example, in order to achieve sufficient redundancy to cope with six concurrent failures of storage elements 300, data objects 500 would need to be replicated six times and stored on redundant storage elements 300. This means that next to the master copy of a data object 500 stored on one storage element 300, six replicas must be stored on six other storage elements. As such storing 1 GB of data objects in this way would result in the need of 7 GB of storage capacity in a distributed object storage system, this means an increase in the storage cost by a factor of seven or an additional storage overhead of 600%. Therefor the distributed object storage system 1 according to the invention makes use of erasure coding techniques in order to achieve the requirements of the reliability policy with considerably less overhead. As will be explained in further detail below when using an erasure encoding with a rate of encoding r=10/16 six concurrent failures of storage element 300 can be tolerated, which only require a storage overhead of 60% or a storage cost by a factor of 1.6. This means that storing 1 GB of data objects in this way only results in the need of 1.6 GB of storage capacity in the distributed object storage system 1. Some erasure encoding techniques make use of Reed-Solomon codes, but also fountain codes or rateless erasure codes such as online codes, LDPC codes, raptor codes and numerous other coding schemes are available.

Figure 5:
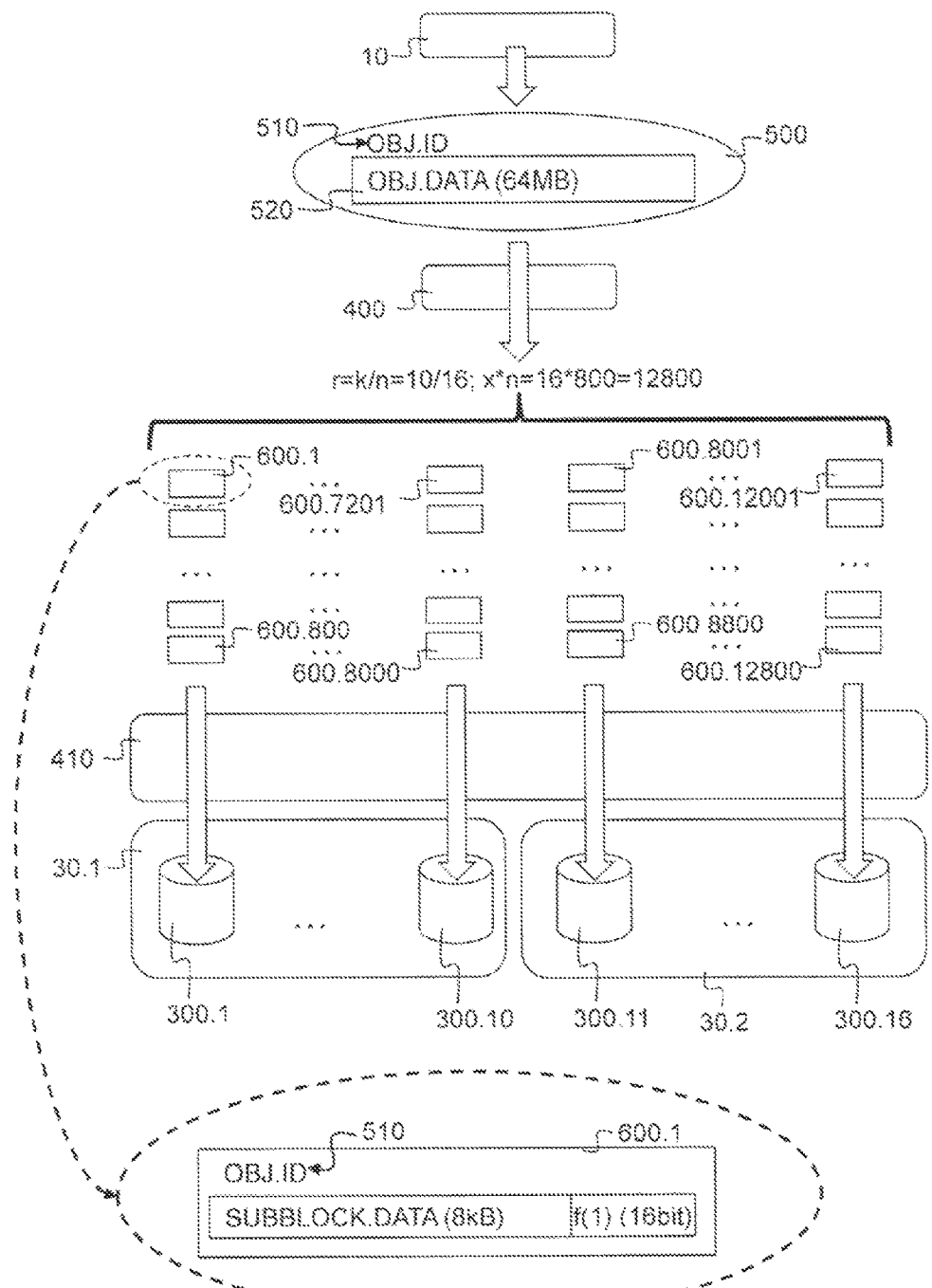
FIG. 5 schematically illustrates a storage operation.

FIG. 5 shows a storage operation performed by an embodiment distributed object storage system 1 that is able to tolerate six concurrent failures of a storage element 300.

The data object 500 is offered to the distributed object storage system 1 by the application 10 requesting a storage operation. In this embodiment, the data object 500 comprises an object identifier 510, such as for example a GUID, and object data 520, for example consisting of 64 MB of binary data. This data object 500 is offered to the encoding module 400 of the controller node 20. The encoder module 400 will disassemble the data object 500 into a predetermined number x*n=16*800=12800 of redundant sub blocks 600, which also comprise the data object identifier 510. This predetermined number x*n=16*800=12800 corresponds to a predetermined multiple x=800 of a desired spreading width n=16. This desired spreading width n=16=k+f=10+6 consists of the sum of a minimal spreading requirement k=10 and a desired concurrent failures tolerance f=6. This desired concurrent failures tolerance f=6 corresponds to the number of storage elements 300 that store sub blocks 600 of said data object 500 and are allowed to fail concurrently as determined by the reliability policy. The minimal spreading requirement k=10, corresponds to the minimal number of storage elements 300 that must store sub blocks 600 of said data object 500 and are not allowed to fail. The encoder module 400 makes use of an erasure encoding scheme to produce these predetermined number x*n=16*800=12800 of redundant sub blocks 600.1-600.12800. In this way, each one of these redundant sub blocks 600, such as for example sub block 600.1 comprises encoded data of equal size of the data object 500 divided by a factor equal to said predetermined multiple of said minimal spreading requirement x*k=80010=8000. This means that the size of sub block 600.1 in the example above with a data object of 64 MB will be 8 kB, as this corresponds to 64 MB divided by x*k=80010=8000. Sub block 600.1 will further comprise decoding data f(1), such that said data object 500 can be decoded from any combination of said redundant sub blocks 600 of which the number x*k=800*10=8000 corresponds to said predetermined multiple x=800 of said minimal spreading requirement k=10. To accomplish this the encoder module 400 will preferably make use of an erasure encoding scheme with a rate of encoding r=k/n=10/16 which corresponds to the minimal spreading requirement k=10 divided by the desired spreading width n=16. In practice this means that the encoder module 400 will first split the data object 500 of 64 MB into x*k=80010=8000 chunks of 8 kB, subsequently using an erasure encoding scheme with a rate of encoding of r=k/n=10/16 it will generate x*n=800*16=12800 encoded redundant sub blocks 600.1-600.12800 which comprise 8 kB of encoded data, this means encoded data of a size that is equal to the 8 kB chunks; and decoding data f(1)-f(12800) that allows for decoding. The decoding data could be implemented as for example a 16-bit header or another small size parameter associated with the sub block 600, such as for example a suitable sub block identifier. Because of the erasure encoding scheme used, namely a rate of encoding r=k/n=10/16, the sub blocks 600.1-600.12800 allow the data object 500 to be decoded from any combination of sub blocks 600 which corresponds to the predetermined multiple of the minimal spreading requirement x*k=80010=8000, such as for example the combination of sub blocks 600.1-600.4000 and sub blocks 600.8001-600.12000. The storage cost of such an erasure coding scheme is inversely proportional to the rate of encoding and in this particular embodiment will be a factor of 1/r=1/(10/16)=1.6. This means that according to this embodiment of the distributed object storage system 1 of the invention 1 GB of data objects 500 will result in a need for a storage capacity of 1.6 GB.

Subsequently, as shown in FIG. 5, the spreading module 410 will store the predetermined number x*n=800*16=12800 of encoded redundant sub blocks 600.1-600.12800 on a number of storage elements 300 which corresponds to said desired spreading width n=16, such as for example storage elements 300.1-300.16. The spreading module 410 will store on each of these storage elements 300.1-300.16 said predetermined multiple x=800 of these sub blocks 600. As shown in FIG. 5 sub blocks 600.1-600.800 are stored on storage element 300.1, the next x=800 of these sub blocks are stored on storage element 300.2 and so on until the last x=800 of these sub blocks 600.12001-12800 are stored on storage element 300.16. As shown in FIG. 5 storage elements 300.1-300.10 are arranged in storage node 30.1 and storage elements 300.11-300.16 are arranged in storage node 30.2.

According to an alternative embodiment the sub blocks could be spread by the spreading module 410 on a number of storage elements 300 which is larger than said desired spreading width n=16, for example n+1=16+1=17 storage elements 300. This could be implemented by for example storing sub blocks 600.12001-600.12400 on storage element 300.16 and storing sub blocks 600.12401-12800 on storage element 300.16. It is clear that this would still allow for the storage system 1 to cope with f=6 concurrent failures of storage elements 300. Alternative methods for determining the share of sub blocks to be stored on specific storage elements 300 are well known to the person skilled in the art and are for example described in WO2009135630.

It is clear that according to alternative embodiments of the invention other values could have been chosen for the parameters x, f, k, n=k+f and r=k/n mentioned in embodiment above, such as for example x=400, f=4, k=12; n=k+f=12+4=16 and r=12/16; or any other possible combination that conforms to a desired reliability policy for redundancy and a corresponding desired concurrent failure tolerance of storage elements 300 of the distributed object storage system 1.

According to still a further alternative there could be provided a safety margin to the number of concurrent failures f that a distributed object storage system 1 needs to be able to cope with. In such an embodiment, some of the efficiency is traded in for some additional redundancy over what is theoretically required. This preventively increases the tolerance for failures and the time window that is available for a repair activity. However according to a preferred embodiment this safety margin will be rather limited such that it only accounts for an increase in sub blocks that must be generated and stored of for example approximately 10% to 30%, such as for example 20%.

Figure 6:
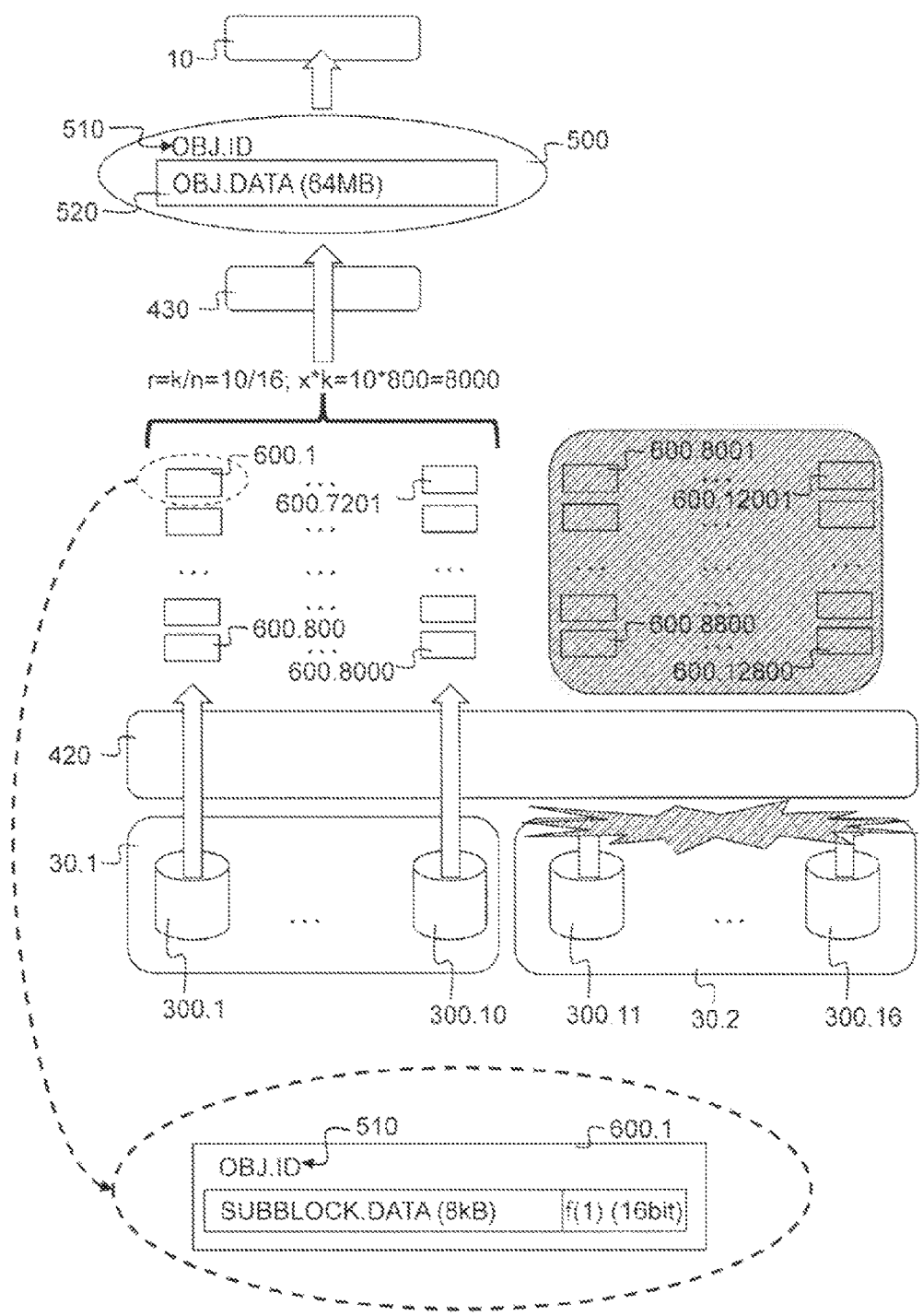
FIG. 6 schematically illustrates a retrieval operation.

FIG. 6 shows a retrieval operation performed by the embodiment of the distributed object storage system 1 as described for the storage operation of FIG. 5 that is able to tolerate six concurrent failures of a storage element 300. The data object 500 is requested from the distributed object storage system 1 by the application 10 requesting a retrieval operation. As explained above, in this embodiment the requested data object 500 can be addressed by its object identifier 510. In response to this request for a retrieval operation the clustering module 420 of the controller node 20 will initiate the retrieval of the sub blocks 600 associated with this data object identifier. It will try to retrieve the predetermined number x*n=16*800=12800 of redundant sub blocks 600.1-600.12800 that were stored on the storage elements 300.1-300.16. Because of the encoding technology used and the corresponding decoding techniques available, it is sufficient for the clustering module 420, to retrieve said predetermined multiple of said minimal spreading requirement x*k=800*10=8000 of said redundant sub blocks 600 from these storage elements 300.1-300.16. This could be the case when for example there is a problem in network connectivity between the controller node 20 and storage node 30.2 as indicated in FIG. 6. In that case the retrieval operation of the clustering module will be able to retrieve the sub blocks 600.1-600.8000 which corresponds to said predetermined multiple of said minimal spreading requirement x*k=800*10=8000. The retrieved sub blocks 600.1-600.8000 allow the decoding module 430 to assemble data object 500 and offer it to the application 10. It is clear that any number in any combination of the redundant sub blocks 600 corresponding to said data object 500, as long as their number is equal to or larger than the predetermined multiple of the minimal spreading requirement x*k=800*10=8000, would have enabled the decoding module 430 to assemble the data object 500.

Figure 7:
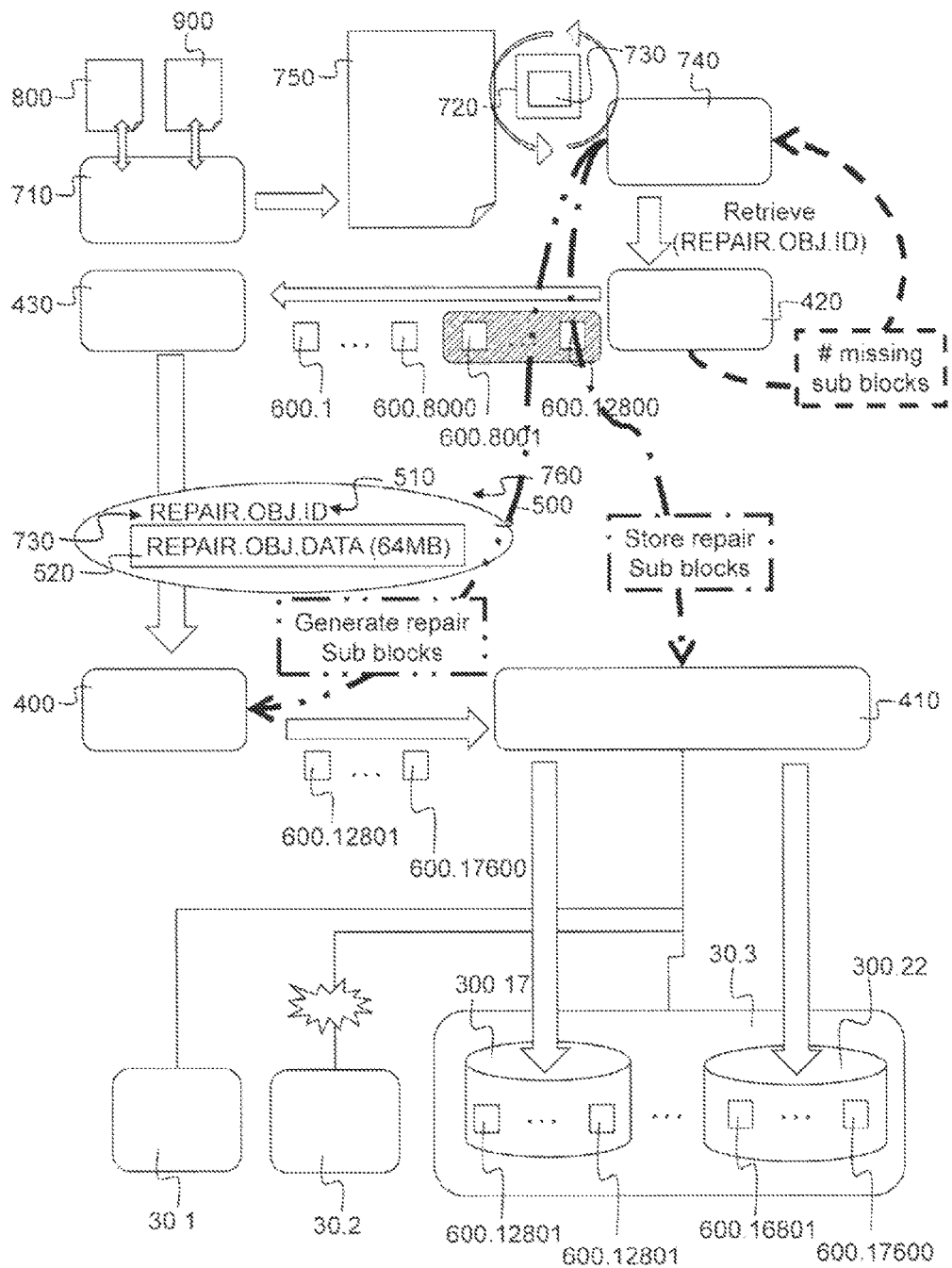
FIG. 7 schematically illustrates a monitoring and repair operation.

As shown in FIG. 7, the distributed object storage system 1 further comprises a monitoring agent 710 which monitors whether the distributed object storage system 1 still correctly stores all data objects that were offered for storage by the application 10. The monitoring agent 710 could perform this monitoring activity on a periodic basis, for example it could check every storage element 300 every ten days, or it could be triggered by a specific event, such as for example a signal indicating that one or more particular storage elements 300 or one or more storage nodes 30 are not available. The monitoring agent 710 can be implemented as programming instructions stored in local memory 230 of the controller node 20 for execution by its processor 220 or alternatively in local memory 330 of one or more of the storage nodes 30 for execution by their processor 320 or any other suitable combination. Multiple monitoring agents 710 could be active concurrently within a distributed object storage system according to the invention. The only requirement is that the monitoring agent 710 is able to connect to the storage nodes 30 comprising data objects 500 being stored in the distributed object storage system 1 which need to be subject to the monitoring process.

When during the monitoring process the monitoring agent 710 detects a data object 500 that is not correctly stored in the distributed object storage system 1, the monitoring agent 710 will treat the data object identifier 510 of this incorrectly stored data object 500, also referred to as a repair data object 760, as a repair data object identifier 730 and is then able to create a repair task 720 comprising this repair data object identifier 730. Repair tasks 720 created by one or more monitoring agents 710 can for example be aggregated in a suitable programmable storage structure, such as for example a repair task list 750, in the memory of the controller node 20 or one or more of the storage nodes 30 of the distributed object storage system 1. In this way, for data objects 500 stored in the distributed data storage system 1 in need of repair, a corresponding entry in the repair task list 750 will be available. An embodiment of such a repair task list 750 comprising a plurality of repair tasks 720 is schematically shown in FIG. 8 and will be explained in more detail below. The column REP.OBJ.ID of the repair task list 750 comprising the repair data object identifier 730 for each of the corresponding repair tasks 720.

According to a preferred embodiment of the invention the monitoring agent 710 checks the status of the storage elements 300 of the distributed object storage system 1 regularly. These checks result in the monitoring agent 710 storing the status of these storage elements 300 in a central infrastructure metadata storage 800. Such a central infrastructure metadata storage 800 is schematically shown in FIG. 9. This central infrastructure metadata storage 800 could be implemented as any type of programmable storage structure for example in the memory 230 of the controller node 20. The central infrastructure metadata storage 800 according to this embodiment stores infrastructure metadata 810 comprising an identifier 830 for each of the storage elements 300 in the column SE.ID and the status 820 of these storage elements 300 in the column ERROR. According to this embodiment the status 820 is indicated with a zero if the respective storage element 300 is available and a non-zero value if the respective storage element 300 is not available. In this way, the infrastructure metadata storage 800 allows the status 820 of all storage elements 300 used in the distributed object storage system 1 to be centrally recorded. Possible states for a storage element 300 are for example available and unavailable. Alternatively, each of these states can be further identified by a plurality of suitable identifiers indicating more specific status information, for example according to an embodiment of the invention instead of a single non-zero identifier indicating that the storage element 300 is unavailable, specific non-zero identifiers in the status column 820 could indicate whether the storage element 300 is offline, abandoned, or some other state.

In order to check the status of the storage elements 300 of the distributed object storage system 1, according to a specific embodiment, the monitoring agent 710 contacts on a periodic basis each of the storage nodes 30 to get current status of each of their storage elements 300, these storage elements 300 being for example hard disk drives. Each storage node 30 periodically assessing the quality of its these hard disk drives by for example obtaining the SMART disk information, by doing explicit disk tests or by keeping its own log of read and write errors or by using some other methods. Once the status of these hard disk drives is determined, the storage node 30 reports this to the central infrastructure metadata storage 800 updating the entries for the corresponding list of storage element statuses 820. Once a storage element 300 is marked unavailable in the infrastructure metadata storage 800 it will not be used for further storage or retrieval operations and the distributed object storage system 1 can for example, based on policies, try to power down this storage element 300 if it is still reachable in order to conserve energy use. Optionally an operator could be provided with a signal to remove or replace this storage element 300. This is especially useful during maintenance operations on large scale distributed object storage systems where adding, removing and/or replacing storage elements or even complete storage nodes is an activity that is performed almost constantly. Such maintenance operations on the distributed object storage system 1 can be performed while it is in operation, reducing the need for manual reconfiguration and even reducing the need for some of the maintenance operations such as for example removing defective storage elements 300.

Subsequently the monitoring agent 710 could mark data objects 500 for repair of which sub blocks 600 are stored on a storage element 300 of which the infrastructure metadata 810 indicates it is unavailable. This can for example be implemented by combining both the metadata 910 of the data objects 500 and the infrastructure metadata 810 of said storage elements 300 as will be explained with reference to FIG. 10.

Alternatively, instead of monitoring the status of the storage elements 300 of the distributed object storage system 1, the monitoring agent 710 could monitor the availability of all storage nodes 30 and record this centrally in the infrastructure metadata storage 800. A storage node 30 can be available or unavailable or some other state. According to one embodiment a monitoring agent 710 running on a controller node 20 can record the availability of its connected storage nodes 30 in the central infrastructure metadata storage 800 by updating the status of the storage elements 300 of the respective storage nodes accordingly. Whenever all storage elements 300 of a storage node 30 become unavailable in the infrastructure metadata storage 800, this storage node 30 will not be used for further storage or retrieval operations and the distributed object storage system 1 can for example, based on policies, try to powered down this storage node 30 if it is still reachable in order to conserve energy use. Optionally an operator could be provided with a signal to remove or replace this storage node 30. As stated above this is especially useful during maintenance operations on large scale distributed object storage systems where adding, removing and/or replacing storage elements or even complete storage nodes is an activity that is performed almost constantly.

As shown in the embodiment of FIG. 10 the distributed storage system 1 also comprises a metadata storage 900. Such a metadata storage 900 could be implemented as a central metadata storage arranged in a controller node 20 and/or a plurality of distributed local metadata storages arranged in the storage nodes 30. Several alternative embodiments implementing a metadata storage 900 in this way have been described in more detail in co-pending application EP11187082.0 which are hereby referred to. During a storage operation, the encoding module 400 and/or the spreading module 410 add for every data object 500 they store a respective entry for its data object identifier; a list of identifiers of the storage elements 300 on which sub blocks 600 of this data object 500 are stored; and an identifier for the type of encoding policy that was used to disassemble this data object 500. When the metadata storage 900 is implemented as a central metadata storage, the controller node 20 comprises such a metadata storage 900 which is for example implemented as a suitable programmable storage facility in its memory 230 as this allows the encoding module 400, spreading module 410, clustering module 420 and decoding module 430 optimal access to this centrally arranged metadata storage during storage, retrieval and repair operations. According to this embodiment the spreading module 410 will add to this central metadata storage the metadata for each data object 500 stored by the controller node 20 comprising this metadata storage 900. As schematically shown in FIG. 10 such a metadata storage 900 comprises for example metadata 910 for three data objects 500, identified as A, B and C, this metadata comprising the data object identifier in the 'OBJ ID' column, a list of the identifiers of the storage elements 300 where the sub blocks 600 of the respective data objects 500 were stored by the spreading module 410 in the 'SE.ID column, and the encoding policy used by the encoding module 400 in the 'ENC' column. In this example the encoding policy used is identified as for example 16/10 which identifies both the minimal spreading requirement k=10 and the desired spreading width n=16. The desired concurrent failure tolerance f=n−k=16−10=6 can be easily derived from this identifier. It is clear that alternative identifiers for the encoding policy could be used like for example 16/6 indicating the desired spreading width n=16 a desired concurrent failure tolerance f=6 or an integer identifier which is linked to a specific encoding policy, or any other suitable identifier for the type of encoding used etc. Amongst other things, the metadata storage 900 allows for efficient retrieval as the clustering module 420 which is able to ascertain from the metadata storage 900, which in this embodiment also resides centrally in the controller node 20, on which specific storage elements 300 a specific data object 500 is stored. It also allows the decoding module 430 to efficiently ascertain which encoding policy was used. Furthermore, such a metadata storage 900 also allows for flexibility in the determination of encoding policies on a per data object basis, this means that the redundancy policy does not need to be fixed for all data objects 500 stored in the distributed object storage system 1, but can be set individually for each specific data object 500. It is clear that according to still further embodiments of the metadata storage 900, the metadata stored for a data object 500 could comprise other suitable entries comprising properties of the data object 500, such as for example version information or the state of the data object 500, which could for example comprise an indication whether the data object 500 was subject to a delete operation.

As explained above, the metadata storage 900 allows the controller node 20 to determine on which storage elements 300 sub blocks 600 of a particular data object 500 can be retrieved. This can be done with high efficiency when consulting the metadata storage 900. In the schematic example shown in FIG. 10, it is shown in its metadata, that sub blocks 600 of data object 500 with object identifier 510 A are stored on storage elements 300 with identifiers 1, 2, 3, 4, 5, 6, 7, 8, 9, 10, 11, 12, 13, 14, 15, 16 and that the type of encoding used is characterised by a minimal spreading requirement k=10 and a desired spreading width n=16 which leads to a desired concurrent failure tolerance f=n−k=16−10=6. Sub blocks 600 of data object 500 with object identifier B are stored on storage elements 300 with identifiers 1, 2, 3, 4, 5, 6, 7, 8, 9, 10, 11, 12, 13, 14, 15, 16, 21, 22 and that the type of encoding used is characterised by a minimal spreading requirement k=10 and a desired spreading width n=18 which leads to a desired concurrent failure tolerance f=n−k=18−10=8. Sub blocks 600 of data object 500 with object identifier C are stored on storage elements 300 with identifiers 2, 3, 4, 5, 6, 7, 8, 9, 10, 11, 12, 13, 14, 15, 16, 17 and that the type of encoding used is characterised by a minimal spreading requirement k=10 and a desired spreading width n=16 which leads to a desired concurrent failure tolerance f=n−k=18−10=6.

When now combining the information provided in the infrastructure metadata storage 800 as shown in FIG. 9 which shows that the storage elements 300 with identifiers 1, 2, 21 and 22 are unavailable and the metadata storage 900 as shown in FIG. 10 it is possible to determine that each of the objects A, B and C is no longer correctly stored as each of them comprises sub blocks 600 which are stored on a storage element 300 that is unavailable. Therefor based upon this information the monitoring agent 710 will be able to add corresponding repair tasks 720 with corresponding repair data object identifiers A, B and C to the repair task list 750 as shown in FIG. 8. However, in a large scale distributed object storage system 1, when a plurality of storage elements 300 or storage nodes 30 becomes unavailable, for example during maintenance operations or when a large number of data objects 500 are stored on specific storage elements 300 or in specific storage nodes 30 there is the risk that a large number of repair tasks 720 are added to the repair task list 750. It is then important to restore the repair data objects 760 to their desired concurrent failure tolerance as soon as possible. According to the invention the monitoring agent 710 will therefore determine the actual concurrent failure tolerance of the repair data object 760. The actual concurrent failure tolerance corresponds to the number of storage elements 300 that actually store sub blocks 600 of the repair data object 760 and are still allowed to fail concurrently. Therefor according to the embodiment shown in FIGS. 8 to 10 the actual concurrent failure tolerance for data object A is 4, as storage elements 300 storing its sub blocks 600 with identifier 1 and 2 are unavailable and the desired concurrent failure tolerance was 6. The actual concurrent failure tolerance for data object B is equally 4, as storage elements 300 storing its sub blocks 600 with identifier 1, 2, 21 and 22 are unavailable and the desired concurrent failure tolerance was 8. The actual concurrent failure tolerance for data object C is 5, as only storage elements 300 storing its sub blocks 600 with identifier 2 is unavailable and the desired concurrent failure tolerance was 8. According to the embodiment as shown in FIG. 8 the monitoring agent 710 adds the actual concurrent failure tolerance for each of the repair data objects 730 to the respective repair task 720 in the repair task list 750 as illustrated with the "ACFT" column.

Now that the monitoring agent 710 has determined the actual concurrent failure tolerance for each of the repair data objects 760, the maintenance agent 740 will be able to execute these repair tasks from the repair task list with an increased efficiency as the maintenance agent will now be able to execute first repair tasks 720 of which said actual concurrent failure tolerance is the lowest. In this way, the maintenance agent 740 will be able to more efficiently focus first on the repair data objects 760 that are most critically in need of repair which will contribute to the overall reliability of the distributed object storage system 1. It is clear that the maintenance agent 740 will in this way enable the maximum mean actual concurrent failure tolerance for all repair data objects 760 being processed. This allows for reliably processing even a large number of repair tasks 720 in a large scale distributed object storage system 1 automatically and by means of the already available monitoring and repair facilities. According to a particular embodiment as shown in FIGS. 8 to 10, this means that the maintenance agent 740 will first process the repair tasks 720 associated with repair data objects A or B as they have the lowest actual concurrent failure tolerance of 4 and afterwards process repair data object C as its actual concurrent failure tolerance is 5. According to an alternative embodiment of the invention it is equally possible for the maintenance agent 740 to determine the actual concurrent failure tolerance for the repair tasks 720 of the repair task list 750 before it starts processing it, instead of relying on the monitoring agent 710 to do this.

In order to still further enhance the efficiency of the repair process optionally the monitoring agent 710 and/or the maintenance agent 740 are able to determine for the repair data objects 760 the difference between the actual concurrent failure tolerance and the desired concurrent failure tolerance of the repair data object 760. In the example shown in FIGS. 8-10 this difference corresponds to 2=6−4 for data object A, 4=8−4 for data object B and 1=6−5. In this example this difference could also be determined from the number of storage elements 300 that store sub blocks 600 for the respective repair data objects and are unavailable. Optionally the monitoring agent 710 and/or the maintenance agent 740 could store this difference in the repair task list 750 as schematically shown with column DIFF in FIG. 8. This will subsequently allow the maintenance agent 740 to execute first the repair tasks 720 of the repair task list of which this difference between said actual concurrent failure tolerance and said desired concurrent failure tolerance is the highest. This means that although for both repair data object A and B the actual concurrent failure tolerance is 4, the maintenance agent will first process the repair task 720 associated with repair data object B as this difference is 4 for repair data object B which is larger than this difference for data object A which is 2. In this way, the maintenance agent 740 will restore the repair data objects 760 that are removed the furthest from their desired concurrent failure tolerance first increasing the overall reliability of the distributed object storage system 1.

As further shown in FIG. 7, the distributed object storage system 1 further comprises a maintenance agent 740 that is able to process the repair tasks 720 by checking the repair task list 750 on a periodic basis and processing one of the repair tasks in it. Optionally the distributed object storage system 1 comprises a plurality of these maintenance agents 740. The maintenance agent 740 can be implemented as programming instructions stored in local memory 230 of the controller node 20 for execution by its processor 220 or alternatively in local memory 330 of one or more of the storage nodes 30 for execution by their processor 320 or any other suitable combination. The maintenance agent 740 must however be enabled to connect to the controller node 20 in order to process the repair tasks 720 from the repair task list and thereby repairing the corresponding repair data object 760 stored in the distributed object storage system 1.

According to a preferred embodiment, as disclosed in co-pending application EP11187082.0, the maintenance agent 740 retrieves a repair task 720 that was created by the monitoring agent 710 from the repair task list as described above and determines the corresponding repair data object identifier 730 comprised within this repair task 720. Subsequently the maintenance agent 740 will instruct the clustering module 420 to execute a repair retrieval operation for the repair data object 760 which corresponds to the repair data object identifier 730. When executing this repair retrieval operation, the clustering module 420 will report back to maintenance agent 740 the number of missing sub blocks 600, which corresponds to the number of sub blocks said clustering module 420 is not able to collect. As such the maintenance agent 740 is able to determine the number of missing sub blocks 600 for this repair data object. For example, a repair task 720 could have been created for the data object 500 as described in FIG. 6, for example because a signal was generated by the distributed object storage system 1 indicating to the monitoring agent that storage node 30.2 was no longer reachable and subsequently the monitoring agent 710 determined that this data object 500 was no longer correctly stored in the distributed object storage system 1. The clustering module 420, when now processing the corresponding repair retrieval operation will initiate an attempt to retrieve the predetermined number x*n=16*800=12800 sub blocks 600.1-600.12800 relating to said repair object identifier. The clustering module 420 will be able to retrieve sub blocks 600.1-600.8000 stored on storage elements 300.1-300.10 that are part of storage node 30.1, while the clustering module 420 will not be able to retrieve sub blocks 600.8001-600.12800 that were stored on storage elements 300.11-300.16 that are part of storage node 30.2. The clustering module 420 in this particular case will report to the maintenance agent 740 that there are 4800 missing sub blocks 600 for this repair data object identifier 730. However, as the clustering module 420 was able to retrieve a number of collected sub blocks 600.1-600.8000 equal to or greater than the predetermined multiple of said minimal spreading requirement x*k=800*10=8000, these sub blocks 600.1-600.8000 will subsequently enable the decoding module 430, as instructed by the maintenance agent 740, to successfully assemble the repair data object 760 as the original data object 500, as shown in FIG. 7, thereby successfully completing the repair retrieval request.

Subsequently, as shown in FIG. 7, the maintenance agent 740 will initiate a repair storage operation by instructing the encoding module 400 to disassemble this repair data object 500 into a specific number of repair sub blocks 600.12801-600.17600, specific number of repair sub blocks being equal to said number of missing sub blocks 600.8001-600.12800. In this particular example the number of missing sub blocks, as well as this specific number of repair sub blocks being equal to 4800.

It is not necessary to know exactly which sub blocks 600 are missing as the probability of generating repair sub blocks 600 which overlap with the already stored sub blocks 600 is sufficiently low, as the encoding technology, such as for example when based on online codes, makes use of randomly generated numbers, such as for example described in more detail in WO2009135630, which reduces the probability of overlap significantly as is well known to the man skilled in the art. In order to still further reduce the probability of overlap, in the case of online codes, as for example described in WO2009135630, the random number generator could be seeded during the repair storage operation with a seed that is known to be different from the seeds used during a normal storage operation. Alternative examples for generating sub block 600 without a realistic probability of overlap with erasure encoding technology are within the knowledge of the man skilled in the art.

The repair storage operation is finalised by the spreading module 410 which stores this specific number of repair sub blocks 600.12801-600.17600, such that these repair sub blocks and the collected sub blocks 600.1-600.8000 are stored on a number of said storage elements 300 being larger or equal to said desired spreading width n=16. In the example shown in FIG. 7 this is accomplished by the spreading module storing repair sub blocks 600.12801-600.17600 on storage elements 300.17-300.22, the share of sub blocks to be stored on the respective storage elements 300 again being determined according to methods being well known to the person skilled in the art such as for example as shown in FIG. 7 repair sub blocks 600.12801-600.13400 on storage element 300.17, . . . , repair sub blocks 600.16801-600.17600 on storage element 300.22. Alternative methods for determining the share of sub blocks 600 to be stored on specific storage elements 300 are well known to the person skilled in the art and are for example described in WO 2009135630.

It is clear that the maintenance agent 740 in this way is able to process a repair task 720 far more efficiently as compared to prior art systems which make use of the regular retrieval and/or storage operation. There is no need for the maintenance agent of the distributed object storage system 1 according to the invention to determine and keep track of exactly what sub blocks 600 are missing, and as such the repair retrieval operation and repair storage operation can be executed more efficiently than prior art repair processes which focus on restoring the specific sub blocks which are missing or corrupt. Furthermore prior art systems don't provide a tailored retrieval or storage operation for the repair operation and as such a fall back on the regular retrieval and storage process, the latter of which will store said predetermined number x*n=800*16=12800 of sub blocks 600 and will thus consume more resources, such as processing power for the encoding module 400, network bandwidth for the spreading module and storage capacity of the storage elements 300 of the distributed object storage system 1.

It is clear that the maintenance agent 740 will still be able to process a repair task 720 more efficiently then prior art systems when the number of repair sub blocks generated is equal to the number of missing sub blocks augmented by a safety margin. In such an embodiment, some of the efficiency is traded in for some additional redundancy in order to preventively cope with future repair needs. As long as the number of missing sub blocks augmented by the safety margin is less then said predetermined number the repair process will be more efficient than known systems, however according to a preferred embodiment this safety margin will be a rather limited amount, such as for example an integer value approximating a share of 10% to 20% of the number of missing sub blocks. It is clear however that the most efficient repair process can be achieved when the safety margin is equal to zero.

In order to still further improve the efficiency of the repair operation the infrastructure metadata storage 800 could also be used to increase the efficiency of the repair retrieval operation. For example, when the maintenance agent 740 instructs the clustering module 430 to retrieve said predetermined number of sub blocks comprising said repair data object identifier, is operable to further instruct said clustering module to consult said central infrastructure metadata storage 800. During the subsequent retrieval of a number of stored sub blocks equal to or greater than said predetermined multiple of said minimal spreading requirement x*k=800*10=8000, the clustering module 430 will exclusively consult storage elements 300 of which the status 820 in said infrastructure metadata 800 indicates they are available. In this way, no time and network traffic is lost on accessing unavailable storage elements 300 or on waiting for sub blocks 600 that are unavailable.

Figures 11, 12:
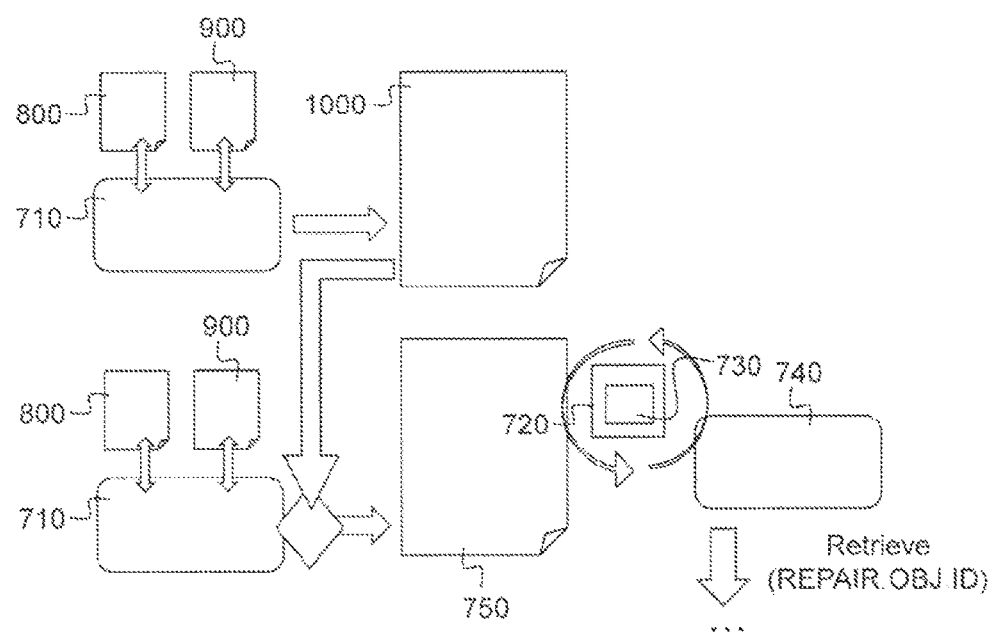
FIG. 11 schematically illustrates an actual concurrent failure tolerance list.
FIG. 12 schematically illustrates an alternative monitoring and repair operation.

However in order to still further enhance the efficiency and scalability of the repair process there is provided a preferred embodiment as schematically represented in FIGS. 11 and 12. In a large scale distributed object storage system 1 where numerous data objects 500 are stored and a plurality of monitoring agents 710 that concurrently add repair tasks 720 the repair task list 750 for every repair data object 760 they encounter during the monitoring process, this repair task list 750 could be too dynamic and/or grow too large to handle efficiently for example during a sorting operation or an insertion operation for arranging the repair tasks 720 of the repair task list 750 in a suitable order with respect to the actual concurrent failure tolerance for handling by the one or more maintenance agents 740. Therefor according to this preferred embodiment at least one of the monitoring agents 710 will perform a specific data mining operation on the distributed object storage system 1 in order to limit the number of repair tasks 720 added to the repair task list 750 such that it remains manageable, even in a large scale distributed object storage system 1 and simplifies or eliminates the sorting operation or insertion operation of repair tasks 720 in the repair task list 720 during the monitoring and/or repair process. During this data mining operation, the monitoring agent 710 will scan the distributed object storage system 1 in order to determine how many repair data objects 760 correspond to a specific actual concurrent failure tolerance. This can be done quickly and efficiently by for example combining the infrastructure metadata 810 with the metadata 910 as explained with reference to FIGS. 9 and 10. As schematically shown in FIG. 11, this monitoring agent 710 could for example aggregate an actual concurrent failure tolerance list 1000 comprising the count of repair data objects 760, shown in the #DO column, for each instance of the actual concurrent failure tolerance, shown in the ACFT column. As shown in the example there are 0 repair data objects 760 with an actual concurrent failure tolerance of 0 or 1, there are 3 repair data objects 760 with an actual concurrent failure tolerance of 2, 10 repair data objects 760 with an actual concurrent failure tolerance of 3, 80 repair data objects with an actual concurrent failure tolerance of 4, etc.

As schematically shown in FIG. 12, based on this actual concurrent failure tolerance list 1000 all other monitoring agents 710 that concurrently add repair tasks 720 to the repair task list 750 will be able to determine a first predetermined threshold. The number of repair tasks 720 aggregated in the repair task list 750 by these monitoring agents 710 can then be kept manageable when repair tasks 720 are aggregated in the repair task list 750 only if the actual concurrent failure tolerance of the corresponding repair data object 760 is smaller than or equal to this first predetermined threshold. Determining the first predetermined threshold is preferably done in function of the lowest actual concurrent failure tolerance for which the corresponding count of repair data objects 760 is larger than zero, which in the example shown in FIG. 11 is the actual concurrent failure tolerance of 2. The first predetermined threshold could simple be equal to this actual concurrent failure tolerance with a non-zero count, in which case the monitoring agents 710 will only add repair tasks for repair data objects 760 of which the actual concurrent failure tolerance is smaller than or equal to 2. But alternatively the first predetermined threshold could be determined in function of this smallest actual concurrent failure tolerance with a non-zero count, for example augmenting it with an integer value of 1 or 2, so that the monitoring agents would add repair tasks for repair data objects 760 of which the actual concurrent failure tolerance is smaller than or equal to 3 or 4. It is clear that many alternative ways of determining a suitable first predetermined threshold are available that can be calculated as a function of at least this lowest actual concurrent failure tolerance for which the count of repair data objects 760 is larger than zero.

In this way, the repair tasks 720 aggregated in the repair task list 750 will be limited to those with an actual concurrent failure tolerance lower than the first predetermined threshold. This will enable the maintenance agent 740 to prioritise the repair process of repair data objects 760 with the lowest actual concurrent failure tolerance even if the repair task list 750 is implemented as a simple first in first out (FIFO) structure while keeping the size of the repair task list 750 manageable. In the example shown in FIGS. 10 and 11, and in an embodiment in which the first predetermined threshold is set to the lowest non-zero actual concurrent failure tolerance. Then the first predetermined threshold will be set initially to 2 and the monitoring agents 710 operating on the distributed object storage system 1 during their monitoring operation will only add the 3 repair data objects with an actual concurrent failure rate of 2 when they detect them. This can be done efficiently as explained above with respect to FIGS. 9 and 10, by combining the information of the infrastructure metadata storage 800 and the metadata storage 900. The one or more maintenance agent 740 can start processing these repair tasks 720 as soon as they are added to the repair task list 750. The repair process in itself which is inherently slower than the monitoring process in this way does not create a bottleneck for the monitoring process. As soon as the repair process for these 3 repair data objects 760 is complete or has at least reached a level at which these 3 repair data objects 760 are stored with an actual concurrent failure tolerance that is higher than 2, then the monitoring agent 710 performing the data mining operation will produce an updated actual concurrent failure tolerance list 1000 in which the repair data object count for the actual concurrent failure tolerance instance 2 has reached 0. The monitoring agents 710 will then automatically lift the threshold to the next instance of an actual concurrent failure tolerance with a non-zero repair data object count, which in the example will then be 3. The monitoring agents 710 will then be adding repair tasks 720 for the 10 repair data objects 760 with an actual concurrent failure tolerance of 3 to the repair task list 750. Once the repair agents 740 have handled these repair tasks also the repair data object count for the actual concurrent failure tolerance of 3 will fall to 0 and the same process will be repeated for the 80 repair data objects with a concurrent failure tolerance of 4, and so on, until all repair data objects 760 have been processed.

The monitoring and repair process as described above with reference to FIGS. 11 and 12 can run on a continuous basis, because as soon as the monitoring agent 710 aggregating the actual concurrent failure tolerance list 1000 updates this list with a non-zero repair data object count for a lower instance of the actual concurrent failure tolerance then the first predetermined threshold will be adapted accordingly and the monitoring agents will again be adding only repair tasks 720 to the repair task list 750 for this lower instance of the actual concurrent failure tolerance. In order to guarantee a specific turnaround time for the repair operations it is preferred to limit the maximum number of repair tasks 720 that can be created in the repair task list 750 when it is implemented as a FIFO structure, which can be calculated in function of desired worst case turnaround time of this FIFO structure for handling a higher priority repair task 720. For example, if the maximum number of repair tasks 720 in the repair task list is limited to 60.000 and the worst-case time for handling a repair task is 10 ms then the worst-case turnaround time for handling a completely full repair task list 750 will be 600 s or 10 minutes. As in this case the number of repair tasks 720 in the repair task list 750 is limited, alternatively, suitable sorting or insertion operations may be applied to the repair tasks 720 so that those associated with the repair data objects 760 with the lowest actual concurrent failure tolerance are handled first by the maintenance agent 740 even further optimizing turnaround time for the most critical repair tasks 720.

According to a further preferred alternative embodiment the repair task list 750 could be implemented as a last in first out (LIFO) structure. In that case repair tasks 720 added last to the repair task list 750 by the monitoring agents 710 will be handled first by the repair agents 740. When combined with the repair and monitoring process as described above with reference to FIGS. 11 and 12, the repair task added last will always be for a repair data object 760 with an actual concurrent failure tolerance lower or equal to the actual first predetermined threshold, even in a situation where the first predetermined threshold is lowered as described above with reference to the alternative FIFO structure. In this way without requiring complex, computing or memory intensive data operations the monitoring and repair operation is able to achieve an even further advance in worst case turnaround time for handling the most critical repair tasks 720 without the need to put a limit on the number of repair tasks 720 in the repair task list 750.

In order to still improve the scalability and robustness of the monitoring and repair process according to further optional embodiments in that the monitoring agents 710 or said maintenance agent 740 are configured to determine the difference between the actual concurrent failure tolerance and the desired concurrent failure tolerance of a repair data object 760, such as for example described with reference to FIG. 8. The monitoring agents 710 are then able to aggregate repair tasks 720 in the repair task list 750 only if the difference of the repair data object 760 is larger than or equal to a second predetermined threshold, which is, similar as the first predetermined threshold, determined in function of at least the highest difference for which the corresponding count of repair data objects 760 is larger than zero. In order to aggregate the count of repair data objects 760 for each instance of said difference the actual concurrent failure tolerance list 1000 could be provided with an extra column enumerating for each instance of the concurrent failure tolerance in the instances of this difference. For example for the 80 repair data objects 760 with an actual concurrent failure tolerance of 4 as shown in FIG. 11 there could be provided two rows in the list 1000, one row for example indicating a count of 20 of these repair data objects 760 where this difference is 4, which means these repair data objects 760 with a desired concurrent failure tolerance of 8 and a second row indicating a count of 60 of these repair data objects 760 where this difference is 2, which means that these repair data objects 760 need to be stored with a desired concurrent failure tolerance of 6. As explained above with reference to the handling repair data objects 760 with the lowest actual concurrent failure tolerance, several similar embodiments can be implemented so that the maintenance agent 740, when executing the of repair tasks 720 from the repair task list 750, first executes the repair tasks 720 of which this difference between the actual concurrent failure tolerance and the desired concurrent failure tolerance for the corresponding repair data object 760 is the highest.

It is clear that although the infrastructure metadata 800, the metadata storage 900 and the actual concurrent failure tolerance list as described above for the preferred embodiments of the invention, although they enable the most efficient embodiments of the invention, can, according to alternative embodiments of the invention be left out while still providing substantial benefits for the repair process when compared to the prior art. It is clear that other embodiments of the monitoring agent 710, can add repair tasks 720 to the repair task list 750, for example by directly checking whether sufficient sub blocks 600 are stored for a specific data object 500 or by directly adding repair tasks 720 for all data objects 500 that are stored on a storage element 300 that is detected to be unavailable, or any other alternative embodiment of the monitoring agent that is able to detect that a data object 500 is not correctly stored, such as for example described in co-pending patent application EP11187082.0.

In general, the method for maintaining a distributed object storage system 1 only requires the monitoring agent 710 and/or the maintenance agent 740 determining the actual concurrent failure tolerance of the repair data objects 760. Merely providing this information could for example already enable an operator of the distributed object storage system 1 to handle a repair operation more efficiently. However, this also enables the one or more maintenance agents 740 to execute first the repair tasks 720 associated with repair data objects 760 of which said actual concurrent failure tolerance is the lowest and as such to repair the most critical repair data objects 760 first increasing the long-term reliability of the object storage system 1 in a scalable and efficient way.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

What is claimed is:

1. A distributed object storage system, comprising:
   a plurality of storage elements configured to store and retrieve a data object, the data object stored as a first number of redundant sub blocks; and
   a controller node coupled with the plurality of storage elements, the controller node including:
   a processor;
   a memory;
   a maintenance agent stored in the memory and executable by the processor to execute a repair task;
   a clustering module stored in the memory and executable by the processor to retrieve remaining redundant sub blocks of the data object and determine a number of missing redundant sub blocks of the data object;
   a decoding module stored in the memory and executable by the processor to assemble a repair data object from the remaining redundant sub blocks of the data object;
   an encoding module stored in the memory and executable by the processor to disassemble the repair data object into a second number of redundant sub blocks, the second number of redundant sub blocks being greater than or equal to the number of missing redundant sub blocks of the data object;
   a spreading module stored in the memory and executable by the processor to store the second number of redundant sub blocks to the plurality of storage elements such that a sum of the second number of redundant sub blocks and a number of the remaining redundant sub blocks is greater than or equal to a desired spreading width for the data object; and
   a monitoring agent stored in the memory and executable by the processor to:

determine an actual concurrent failure tolerance of the data object, wherein the actual concurrent failure tolerance corresponds to an actual number of storage elements that store the remaining redundant sub blocks of the data object and are allowed to fail concurrently;

determine a difference between the actual concurrent failure tolerance of the data object and a desired concurrent failure tolerance of the data object, wherein the desired concurrent failure tolerance corresponds to a maximum number of storage elements that store the first number of redundant sub blocks that are allowed to fail concurrently; and generate the repair task in response to determining that the difference between the actual concurrent failure tolerance of the data object and the desired concurrent failure tolerance of the data object satisfies a first threshold.

2. The distributed object storage system of claim 1, wherein:

the first number of redundant sub blocks corresponds to a predetermined multiple of the desired spreading width; and the desired spreading width equals a sum of: a minimal spreading requirement, corresponding to a minimal number of storage elements that store the first number of redundant sub blocks that are not allowed to fail, and the desired concurrent failure tolerance.

3. The distributed object storage system of claim 2, wherein a redundant sub block of the first number of redundant sub blocks comprises:

a data object identifier;

encoded data of a size of the data object divided by a factor equal to a predetermined multiple of the minimal spreading requirement; and decoding data, such that the data object can be decoded from a subset of the first number of redundant sub blocks, wherein the subset includes any combination of a number of the first number of redundant sub blocks equal to the minimal spreading requirement.

4. The distributed object storage system of claim 1, wherein the monitoring agent is further executable by the processor to generate the repair task in response to determining that the actual concurrent failure tolerance of the data object satisfies a second threshold.

5. The distributed object storage system of claim 4, wherein the monitoring agent is further executable by the processor to:

aggregate a repair task list comprising a plurality of repair tasks associated with a corresponding plurality of data objects that are not correctly stored in the distributed object storage system; and determine the second threshold as a function of the lowest actual concurrent failure tolerance of the plurality of data objects associated with the plurality of repair tasks.

6. A method, comprising:

identifying that a data object stored as a first number of redundant sub blocks on a plurality of storage elements in a distributed object storage system is not correctly stored in the distributed object storage system;

determining an actual concurrent failure tolerance of the data object, wherein the actual concurrent failure tolerance corresponds to an actual number of storage elements that store remaining redundant sub blocks of the data object and are allowed to fail concurrently;

determining a difference between the actual concurrent failure tolerance of the data object and a desired concurrent failure tolerance of the data object, wherein the desired concurrent failure tolerance corresponds to a maximum number of storage elements that store the first number of redundant sub blocks that are allowed to fail concurrently;

generating, in response to determining that the difference between the actual concurrent failure tolerance of the data object and the desired concurrent failure tolerance of the data object satisfies a first threshold, a repair task for the data object; and executing the repair task, including:
retrieving remaining redundant sub blocks of the data object;
determining a number of missing redundant sub blocks of the data object;
assembling a repair data object from the remaining redundant sub blocks of the data object;
disassembling the repair data object into a second number of redundant sub blocks, the second number of redundant sub blocks being greater than or equal to the number of missing redundant sub blocks of the data object; and
storing the second number of redundant sub blocks to the plurality of storage elements such that a sum of the second number of redundant sub blocks and a number of the remaining redundant sub blocks is greater than or equal to a desired spreading width for the data object.

7. The method of claim 6, wherein:

the first number of redundant sub blocks corresponds to a predetermined multiple of the desired spreading width; and the desired spreading width equals a sum of: a minimal spreading requirement, corresponding to a minimal number of storage elements that store the first number of redundant sub blocks that are not allowed to fail, and the desired concurrent failure tolerance.

8. The method of claim 7, wherein a redundant sub block of the first number of redundant sub blocks comprises:

a data object identifier;

encoded data of a size of the data object divided by a factor equal to a predetermined multiple of the minimal spreading requirement; and decoding data, such that the data object can be decoded from a subset of the first number of redundant sub blocks, wherein the subset includes any combination of a number of the first number of redundant sub blocks equal to the minimal spreading requirement.

9. The method of claim 6, further comprising generating the repair task in response to determining that the actual concurrent failure tolerance of the data object satisfies a second threshold.

10. The method of claim 9, further comprising:

aggregating a repair task list comprising a plurality of repair tasks associated with a corresponding plurality of data objects that are not correctly stored in the distributed object storage system; and determining the second threshold as a function of the lowest actual concurrent failure tolerance of the plurality of data objects associated with the plurality of repair tasks.

11. A distributed object storage system, comprising:

means for storing and retrieving a data object, the data object stored as a first number of redundant sub blocks;

a processor;

a memory;

means, stored in the memory and executable by the processor, for executing a repair task;

means, stored in the memory and executable by the processor, for retrieving remaining redundant sub blocks of the data object and determining a number of missing redundant sub blocks of the data object;

means, stored in the memory and executable by the processor, for assembling a repair data object from the remaining redundant sub blocks of the data object;

means, stored in the memory and executable by the processor, for disassembling the repair data object into a second number of redundant sub blocks, the second number of redundant sub blocks being greater than or equal to the number of missing redundant sub blocks of the data object;

means, stored in the memory and executable by the processor, for storing the second number of redundant sub blocks such that a sum of the second number of redundant sub blocks and a number of the remaining redundant sub blocks is greater than or equal to a desired spreading width for the data object;

means, stored in the memory and executable by the processor, for determining an actual concurrent failure tolerance of the data object, wherein the actual concurrent failure tolerance corresponds to an actual number of storage elements that store the remaining redundant sub blocks of the data object and are allowed to fail concurrently;

means, stored in the memory and executable by the processor, for determining a difference between the actual concurrent failure tolerance of the data object and a desired concurrent failure tolerance of the data object, wherein the desired concurrent failure tolerance corresponds to a maximum number of storage elements that store the first number of redundant sub blocks that are allowed to fail concurrently; and means, stored in the memory and executable by the processor, for generating the repair task in response to determining that the difference between the actual concurrent failure tolerance of the data object and the desired concurrent failure tolerance of the data object satisfies a first threshold.

12. The distributed object storage system of claim 11, wherein:
the first number of redundant sub blocks corresponds to a predetermined multiple of the desired spreading width; and
the desired spreading width equals a sum of: a minimal spreading requirement, corresponding to a minimal number of storage elements that store the first number of redundant sub blocks that are not allowed to fail, and the desired concurrent failure tolerance.

13. The distributed object storage system of claim 11, further comprising means for generating the repair task in response to determining that the actual concurrent failure tolerance of the data object satisfies a second threshold.

14. The distributed object storage system of claim 13, further comprising:
means for aggregating a repair task list comprising a plurality of repair tasks associated with a corresponding plurality of data objects that are not correctly stored in the distributed object storage system; and
means for determining the second threshold as a function of the lowest actual concurrent failure tolerance of the plurality of data objects associated with the plurality of repair tasks.

15. The distributed object storage system of claim 12, wherein a redundant sub block of the first number of redundant sub blocks comprises:
a data object identifier;
encoded data of a size of the data object divided by a factor equal to a predetermined multiple of the minimal spreading requirement; and
decoding data, such that the data object can be decoded from a subset of the first number of redundant sub blocks, wherein the subset includes any combination of a number of the first number of redundant sub blocks equal to the minimal spreading requirement.

\* \* \* \* \*